United States Patent [19]

Rosen et al.

[11] 4,053,841
[45] Oct. 11, 1977

[54] MICROWAVE FREQUENCY DISCRIMINATOR COMPRISING AN FET AMPLIFIER

[75] Inventors: Arye Rosen, Cherry Hill; Louis Sebastian Napoli, Hamilton Square, both of N.J.

[73] Assignee: RCA Corporation, New York, N.Y.

[21] Appl. No.: 722,582

[22] Filed: Sept. 13, 1976

[51] Int. Cl.[2] .............................................. H03D 3/26
[52] U.S. Cl. .................................. 329/103; 307/233 R; 328/140; 329/119; 329/134; 329/192; 329/205 R; 330/277
[58] Field of Search ................ 329/103, 116, 119, 134, 329/192, 205 R, 206; 307/233 R; 328/140; 330/35, 53

[56] References Cited

U.S. PATENT DOCUMENTS

| | | | |
|---|---|---|---|
| 3,163,826 | 12/1964 | Kemper | 329/119 X |
| 3,676,785 | 7/1972 | Pichal | 329/103 |
| 3,975,699 | 8/1976 | Van Anda et al. | 328/140 X |

Primary Examiner—Siegfried H. Grimm
Attorney, Agent, or Firm—H. Christoffersen; Joseph D. Lazar; Robert M. Rodrick

[57] ABSTRACT

A microwave frequency discriminator comprising a field effect transistor (FET) amplifier including an input impedance shaping network, a biasing circuit and a detector. The FET is biased to generate an output RF signal within a predetermined frequency bandwidth in response to an input RF signal of substantially constant power level. The input shaping network is formed to augment the frequency gain roll-off characteristic of the FET and the biasing circuit is used to electronically match the impedance of the FET output to the input of the detector. At such conditions of matched impedances the output dc voltage of the detector varies substantially linearly throughout the frequency bandwidth as a function of the frequency of the input RF signal approximating the characteristic of a frequency discriminator.

12 Claims, 3 Drawing Figures

MICROWAVE FREQUENCY DISCRIMINATOR COMPRISING AN FET AMPLIFIER

The Government has rights in this invention pursuant to Contract No. N00039-74-C-0227 awarded by the Department of the Navy.

CROSS REFERENCE TO RELATED APPLICATIONS

Of interest are the following copending applications: Ser. No. 714,356 (RCA 70,075) filed Aug. 16, 1976, entitled, "Microwave Frequency Discriminator," Ser. No. 722,585 (RCA 70,204) filed on even date herewith, entitled "Microwave Frequency Discriminator Comprising an FET Amplifier," both based on the inventions of Daniel David Mawhinney and Zygmond Turski; Ser. No. 722,829 (RCA 70,221) filed on even date herewith, entitled "Microwave Frequency Discriminator Comprising a One Port Active Device," based on the invention of Zygmond Turski and Arye Rosen, all assigned to the same assignee as is the present invention.

BACKGROUND OF THE INVENTION

1. Field of the Invention

This invention relates to a microwave frequency discriminator and more particularly to a discriminator comprising a field effect transistor and including a biasing circuit for electronically obtaining impedance matching conditions.

2. Description of the Prior Art

Techniques and devices for the rapid and accurate determination of an unknown signal frequency are of significant interest in modern communication systems, in particular, for electronic counter measure (ECM) systems operating at microwave frequencies. Microwave frequency discriminators capable of converting incoming unknown frequencies into voltages for processing are often used in ECM systems. A microwave frequency discriminator may be defined as a circuit that provides an output voltage which is a predetermined function of and usually proportional to the frequency of an incoming signal. The discriminator voltage output versus frequency response, commonly termed the "discriminator characteristic," is the respone in which the output voltage varies nearly linearly with respect to frequency over a predetermined frequency bandwidth. The bandwidth is generally determined by the slope, linearity, and resolution of the discriminator and is the frequency range over which the discriminator provides an unambiguous voltage output which is related to the input frequency.

A typical prior art broadband microwave discriminator utilizes passive elements such as transmission lines or an arrangement of lumped elements to vary the power level of the input signal applied to a detector diode as a function of frequency. Such a discriminator formed of various passive components, generally, disadvantageously, has a large number of connections between the components. Such interconnections of the components within the disciminator often produce impedance mismatches resulting in undesirable inflection points in the relation between input frequency and output voltage such that a certain voltage can occur at several frequencies. Such distortions in the discriminator characteristic curve limit the broadband resolution of the discriminator minimizing thereby the accuracy of the system.

Most prior art discriminators are preceded with a limiter to provide a constant power input to the discriminator, whereby the output voltage of the discriminator is a function of frequency alone. Limiters may not be required, however, if the incoming signal has a relatively constant magnitude. Since such a prior art passive discriminator network has no gain, the voltage output which it can produce is restricted by the power available from the limiter preceding the discriminator. The overall linearity and usable bandwidth of the discriminator is also restricted by the frequency response and uniformity characteristics of each of the many elements of such a passive discriminator. In addition, the numerous interconnections in the passive discriminator produce multiple wave reflections which cause distortions of the frequency-voltage discriminator characteristic which reduce the accuracy and usable frequency range of the discriminator.

SUMMARY OF THE INVENTION

According to the present invention, a microwave frequency discriminator comprises a transistor amplifier including a field effect transistor having first, second and third electrodes. The amplifier has an input port for receiving an input RF signal of substantially constant power level and an output port. The transistor is biased an amount for generating in response to the input RF signal an output RF signal having a predetermined frequency gain roll-off characteristic within a predetermined frequency bandwidth. An input shaping network is connected to the input port, the input shaping network being formed to augment the frequency gain roll-off characteristic of the FET. A detector responsive to the output RF signal generates a dc signal. Biasing means responsive to a predetermined bias voltage is included for matching the output impedance of the transistor with the input impedance to the detector. At such conditions of matched impedances the voltage of the dc signal varies substantially linearly as a function of the frequency of the input RF signal.

In an environment of a wide band RF signal of varying power level, limiter means may be used to provide an RF signal of substantially constant power level to the amplifier.

DETAILED DESCRIPTION OF THE PREFERRED EMBODIMENTS

Figure 1:
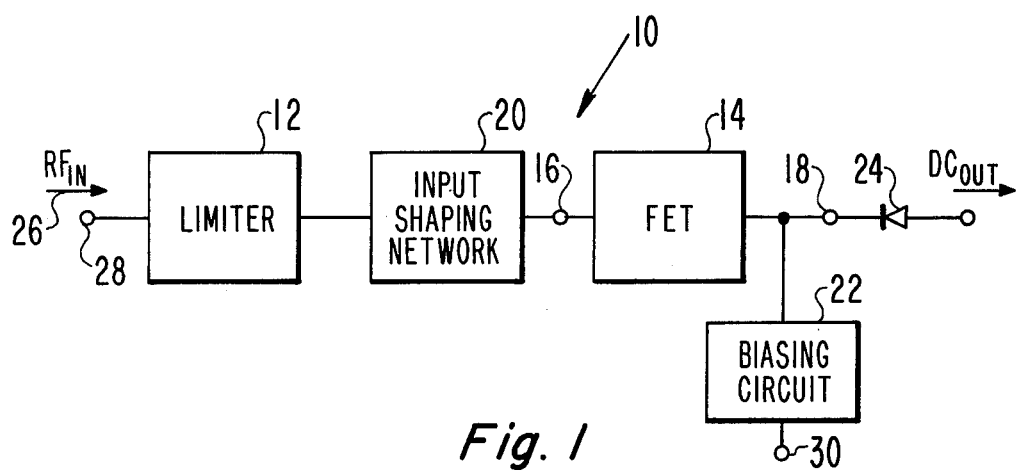
FIG. 1 is a schematic representation of a microwave frequency discriminator of the present invention.

Referring to the drawing, there is shown in FIG. 1, a schematic diagram of one embodiment of a microwave frequency discriminator 10. Discriminator 10 includes a limiter 12, a field effect transistor (FET) 14, having an input port 16 and an output port 18, input shaping network 20, a biasing circuit 22 and a detector diode 24, such as a beam lead Schottky diode.

An input RF signal 26 of unknown frequency, which may be of variable power level is applied to the input 28 and processed by limiter 12. The function of limiter 12 is to provide an output RF signal having a predetermined power level which is invariant with the power level and frequency of the incoming signal, so that it may be processed as hereinafter described. It should be understood that limiter 12 may be unnecessary and eliminated if the incoming RF signal 26 has a relatively constant power level.

In a preferred embodiment of the invention, FET 14 is a gallium-arsenide (GaAs) Schottky barrier field effect transistor for its desirable high gain properties in a selected frequency range although any FET device may be used. FET 14 is arranged to operate as a transistor amplifier by application of a suitable bias voltage to generate an output RF signal having a predetermined frequency gain roll-off characteristic. The bias voltage is applied as by biasing circuit 22, biasing circuit 22 being connected as by terminal 30 to a voltage source (not shown). Biasing circuit 22 is also used to provide desirable impedance matching conditions between FET 14 and detector diode 24 as will be explained in detail subsequently.

In a preferred embodiment of the invention, FET 14 and detector diode 24 are integrated on a single microwave integrated circuit (MIC) in a microstrip circuit transmission line to minimize the number of electrical connections and electrical lengths. Other transmission lines, such as, for example, coaxial line circuits, waveguide circuits and stripline circuits may also be used. Input shaping network 20, connected to input port 16 and to limiter 12 to receive the limited incoming RF signal, is similarly in microstrip circuit transmission line form. Variations in the network geometric shape change the impedance conditions of the transmission line. The configuration providing for desirable impedance conditions between limiter 12 and FET 14 is selected for a specific discriminator application. Shaping network 20 may comprise a tuning stub to achieve such impedance conditions in a microstrip circuit transmission line, the shape and location of the stub being determined by the changes desired in the impedance conditions. For example, in one discriminator application, the FET roll-off characteristic is shaped by the impedance condition provided by shaping network 20 such that the FET roll-off characteristic varies substantially linearly as a function of frequency. More specifically, the intrinsic property of an FET amplifier having a frequency shaped roll-off characteristic is enhanced and linearized using an input shaping network. The shaping network may be designed by the technique of computer optimization routines in which the transmission line elements are varied while seeking iteratively a linear voltage/frequency discriminator characteristic.

Figure 2:
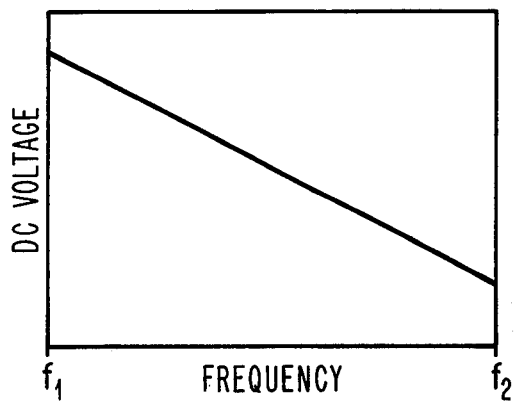
FIG. 2 is a graph showing dc voltage versus frequency useful in describing the present invention.

According to the present invention, biasing circuit 22, in addition to biasing FET 14, is utilized to match the output impedance of FET 14 with the input impedance of detector diode 24. At such conditions of matched impedances as provided by biasing circuit 22, the high frequency gain roll-off characteristic of the FET has a power-frequency response which is substantially linear throughout a predetermined frequency bandwidth. The high frequency gain roll-off characteristic is augmented by shaping network 20, as explained above. Such a linear power-frequency response is converted by detector diode 24 to a substantially linear dc voltage-frequency response approximating a linear discriminator characteristic throughout the predetermined frequency range from $f_1$ to $f_2$ as shown in FIG. 2. For example, in the practice of the invention the frequency may be in the range of 7 GHz to 11 GHz.

Figure 3:
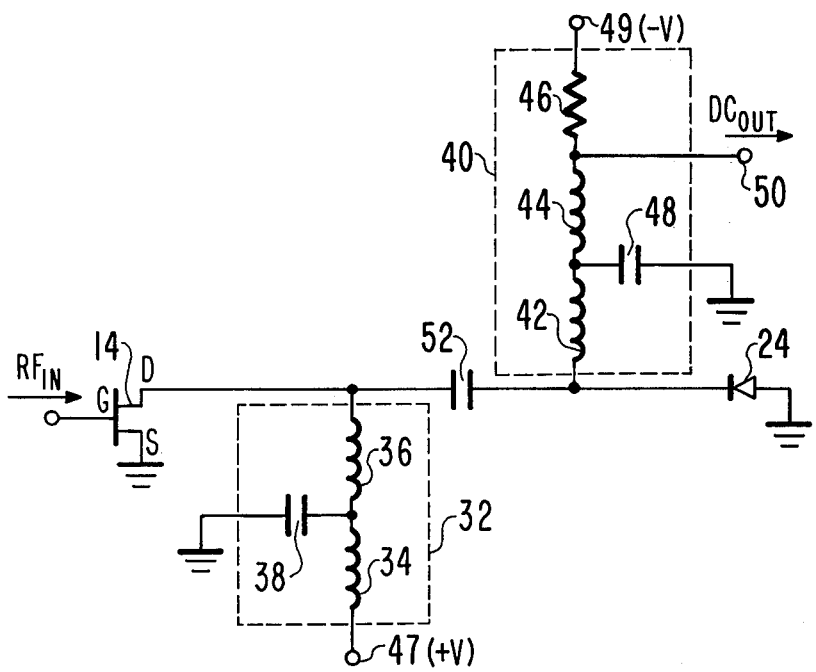
FIG. 3 is a schematic representation of a portion of a microwave discriminator according to a preferred embodiment of the invention.

In a preferred embodiment of the invention as detailed in FIG. 3, FET 14 has its three electrodes arranged as gate G source S and drain D electrodes and a drain biasing circuit 32 electrically connected to drain electrode D. Circuit 32 is connected at terminal 47 to a pulsed or dc bias voltage (not shown) as the biasing drain voltage of FET 14. Circuit 32, comprising serially connected inductors 34 and 36 and a capacitor 38 connected in shunt to ground, serves as a filter network, blocking the RF signal from the drain bias voltage.

A detector biasing circuit 40 is electrically connected to the input(cathode) of detector diode 24 to bias the forward current through detector diode 24. Circuit 40 is connected at terminal 49 to a pulsed or dc voltage (not shown) to provide the detector with a voltage for biasing the forward current. Circuit 40, comprising serially connected inductors 42 and 44 and resistor 46 and a capacitor 48 connected to ground also serves as a filter network, blocking the RF signal from the detector bias voltage. In this preferred embodiment, one terminal (anode) of detector 24 is connected to ground and the dc voltage output is passed out by circuit 40 through terminal 50. In the configurations shown, the detector bias voltage is negative, however, it may be positive if the polarity of detector diode 24 is reversed. A blocking capacitor 52 is used to isolate the drain bias voltage from the detector bias voltage.

According to this embodiment of the invention, the matching condition between the output impedance of FET 14 and the input impedance to detector diode 24 is a function of both the drain voltage and the forward current through detector diode 24. The desired matching condition is achieved electronically by the biasing drain voltage and forward detector current as by drain biasing circuit 32 and detector biasing circuit 40, respectively. Such biasing may be achieved with either biasing circuit alone or in combination, the combined biasing providing a greater range of impedance condition variations. Furthermore, by applying to drain D and detector 24 a voltage from a variable voltage source, the impedance conditions can be electronically varied to change the slope of the substantially linear dc voltage-frequency response of the discriminator.

As previously described, the linear power-frequency signal of FET 14 is received by detector diode 24 and converted into a dc output signal for subsequent processing (not shown). It is preferable that detector diode 24 be of the square law type. A square law detector has a characteristic $V_{out}=kV_{in}^2$, where $k$ is the detector sensitivity factor, such that the output dc voltage will vary substantially linearly as a function of the input RF signal.

The microwave frequency discriminator of the present invention as herein described achieves the desired linear frequency discriminator characteristic without the passive components of the prior art which, because of the double path structure and numerous interfaces, require critical dynamic impedance matching. Minimization of the number of connections and the overall electrical length of the device results in a voltage-frequency response which is relatively free of finegrain variations increasing thereby the operational bandwidth and improving the resolution of the discriminator. In addition, the FET is an active device which produces a power gain eliminating the requirement of subsequent signal amplification. Furthermore, elimination of the passive components results in a decrease in size and a reduction in cost. Such an FET device as described herein, including the FET device and the detector diode as well as the biasing circuits and input shaping network may be fabricated on a single microwave integrated circuit (MIC) structure for improved performance and further size and cost reductions.

Although the invention can be used to scan for and detect signals of an unknown frequency in electronic-counter measure (ECM) systems, the invention can also be used in scanning for frequency modulated signals. The detector output will generate a dc signal representing the modulating signal.

What is claimed is:

1. A microwave frequency discriminator comprising:
   a transistor amplifier including a field effect transistor having first, second and third electrodes, said transistor amplifier having an output port, and an input port for receiving an input RF signal of substantially constant power level, said transistor being biased an amount for generating in response to said input RF signal an output RF signal having a predetermined frequency gain roll-off characteristic within a predetermined frequency bandwidth;
   input shaping means connected to said input port, said input shaping means being formed to augment said transistor frequency gain roll-off characteristic;
   detector means responsive to said output RF signal for generating a dc signal; and
   biasing means responsive to a predetermined bias voltage for matching the output impedance of said transistor with the input impedance of said detector means,
   whereby at said conditions of matched impedances the voltage of said dc signal varies substantially linearly as a function of the frequency of said input RF signal.

2. A microwave frequency discriminator according to claim 1, wherein said detector means comprises a square law detector.

3. A microwave frequency discriminator according to claim 1, wherein said predetermined bias voltage is variable, the slope of said substantially linear dc voltage-frequency response being adjustable with changes in said variable voltage.

4. A microwave frequency discriminator according to claim 1, wherein said biasing means comprises a detector biasing circuit electrically connected to said detector means for biasing the forward current through said detector means to provide said impedance matching conditions.

5. A microwave frequency discriminator according to claim 1, wherein said first, second and third transistor electrodes are arranged as gate, source and drain electrodes respectively, and wherein said biasing means comprises a drain biasing circuit electrically connected to said drain electrode for biasing the drain voltage of said field effect transistor to provide said impedance matching conditions.

6. A microwave frequency discriminator according to claim 5, wherein said biasing means further comprises a detector biasing circuit electrically connected to said detector means and means for blocking the bias voltage of said drain biasing circuit from the bias voltage of said detector biasing circuit, said detector biasing circuit combining with said drain biasing circuit to provide said impedance matching conditions.

7. A microwave frequency discriminator comprising:
   signal limiting means responsive to an input RF signal of varying power level for generating an RF signal of substantially constant power level;
   a transistor amplifier including a field effect transistor having first, second and third electrodes, said transistor amplifier having an output port, and an input port for receiving said RF signal of substantially constant power level, said transistor being biased an amount of generating in response to said RF signal of substantially constant power level an output RF signal having a predetermined frequency gain roll-off characteristic within a predetermined frequency bandwidth;
   input shaping means connected to said limiting means and to said amplifier input port, said input shaping means being formed to augment said transistor frequency gain roll-off characteristic;
   detector means responsive to said output RF signal for generating a dc signal; and
   biasing means responsive to a predetermined bias voltage for matching the output impedance of said transistor with the input impedance of said detector means,
   whereby at said conditions of matched impedances the voltage of said dc signal varies substantially linearly as a function of the frequency of said input RF signal.

8. A microwave frequency discriminator according to claim 7, wherein said detector means comprises a square law detector.

9. A microwave frequency discriminator according to claim 7, wherein said predetermined bias voltage is variable, the slope of said substantially linear dc voltage-frequency response being adjustable with changes in said variable voltage.

10. A microwave frequency discriminator according to claim 7, wherein, said biasing means comprises a detector biasing circuit electrically connected to said detector means for biasing the forward current through said detector means to provide said impedance matching conditions.

11. A microwave frequency discriminator according to claim 7, wherein, said first, second and third transistor electrodes are arranged as gate, source and drain electrodes, respectively, and wherein said biasing means comprises a drain biasing circuit electrically connected to said drain electrode for biasing the drain voltage of said field effect transistor to provide said impedance matching conditions.

12. A microwave frequency discriminator according to claim 11, wherein, said biasing means further comprises a detector biasing circuit electrically connected to said detector means for biasing the forward current through said detector means and means for blocking the bias voltage of said drain biasing circuit from the bias voltage of said detector biasing circuit, said detector biasing circuit combining with said drain biasing circuit to provide said impedance matching conditions.

* * * * *